United States Patent
Roig-Guitart et al.

(10) Patent No.: US 8,648,398 B2
(45) Date of Patent: Feb. 11, 2014

(54) ELECTRONIC DEVICE AND A TRANSISTOR INCLUDING A TRENCH AND A SIDEWALL DOPED REGION

(71) Applicants: Jaume Roig-Guitart, Oudenaarde (BE); Peter Moens, Zottegem (BE); Marnix Tack, Merelbeke (BE)

(72) Inventors: Jaume Roig-Guitart, Oudenaarde (BE); Peter Moens, Zottegem (BE); Marnix Tack, Merelbeke (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/627,287

(22) Filed: Sep. 26, 2012

(65) Prior Publication Data
US 2013/0020637 A1    Jan. 24, 2013

Related U.S. Application Data

(62) Division of application No. 12/331,985, filed on Dec. 10, 2008, now Pat. No. 8,298,889.

(51) Int. Cl.
*H01L 29/78*     (2006.01)

(52) U.S. Cl.
USPC .............. 257/263; 257/E29.131; 257/E29.26; 257/E29.262; 257/E29.318; 257/E21.41

(58) Field of Classification Search
None
See application file for complete search history.

(56) References Cited

U.S. PATENT DOCUMENTS

| | | | |
|---|---|---|---|
| 5,077,228 A | 12/1991 | Eklund et al. | |
| 5,213,999 A | 5/1993 | Sparks et al. | |
| 5,445,988 A | 8/1995 | Schwalke | |
| 5,701,026 A * | 12/1997 | Fujishima et al. | 257/510 |
| 6,194,761 B1 | 2/2001 | Chiozzi et al. | |
| 6,218,725 B1 | 4/2001 | Jeon | |
| 6,461,900 B1 | 10/2002 | Sundaresan et al. | |
| 7,285,822 B2 | 10/2007 | Bhalla et al. | |
| 2001/0002055 A1 | 5/2001 | Clampitt et al. | |
| 2002/0024091 A1 | 2/2002 | Mo | |
| 2002/0140039 A1 | 10/2002 | Adkisson et al. | |
| 2003/0227052 A1 * | 12/2003 | Ono et al. | 257/341 |

(Continued)

FOREIGN PATENT DOCUMENTS

| | | |
|---|---|---|
| EP | 0747966 A2 | 12/1996 |
| WO | WO2006017376 A2 | 2/2006 |
| WO | WO2008042492 A2 | 4/2008 |

OTHER PUBLICATIONS

Stanley Wolf and Richard N. Tauber, Silicon Processing for the VLSI ERA, vol. 1: Process Technology, Lattice Press, Sunset Beach, California, Copyright 1986, pp. 292-294.

*Primary Examiner* — Fei Fei Yeung Lopez
(74) *Attorney, Agent, or Firm* — Abel Law Group, LLP

(57) ABSTRACT

An electronic device can include a first layer having a primary surface, a well region lying adjacent to the primary surface, and a buried doped region spaced apart from the primary surface and the well region. The electronic device can also include a trench extending towards the buried doped region, wherein the trench has a sidewall, and a sidewall doped region along the sidewall of the trench, wherein the sidewall doped region extends to a depth deeper than the well region. The first layer and the buried region have a first conductivity type, and the well region has a second conductivity type opposite that of the first conductivity type. The electronic device can include a conductive structure within the trench, wherein the conductive structure is electrically connected to the buried doped region and is electrically insulated from the sidewall doped region. Processes for forming the electronic device are also described.

20 Claims, 11 Drawing Sheets

(56) References Cited

U.S. PATENT DOCUMENTS

| | | |
|---|---|---|
| 2005/0142713 A1* | 6/2005 | Fujishima et al. ............ 438/197 |
| 2006/0030142 A1 | 2/2006 | Grebs et al. |
| 2006/0076629 A1 | 4/2006 | Yilmaz |
| 2006/0125045 A1 | 6/2006 | Yilmaz |
| 2006/0131647 A1 | 6/2006 | Meyer |
| 2006/0197151 A1 | 9/2006 | Kobayashi et al. |
| 2007/0004116 A1 | 1/2007 | Hshieh |
| 2007/0023855 A1 | 2/2007 | Hossain et al. |
| 2007/0080399 A1 | 4/2007 | Takaishi |
| 2008/0023787 A1 | 1/2008 | Shimada et al. |
| 2008/0122025 A1 | 5/2008 | Roggenbauer et al. |
| 2008/0191277 A1 | 8/2008 | Disney et al. |
| 2009/0014790 A1 | 1/2009 | Otake et al. |

* cited by examiner

ELECTRONIC DEVICE AND A TRANSISTOR INCLUDING A TRENCH AND A SIDEWALL DOPED REGION

RELATED APPLICATION

This application is a divisional of and claims priority under 35 U.S.C. §120 to U.S. patent application Ser. No. 12/331, 985 entitled "Electronic Device Including a Trench and a Conductive Structure Therein and a Process of Forming the Same" by Roig-Guitart et al. filed Dec. 10, 2008, which is assigned to the current assignee hereof and incorporated herein by reference in its entirety.

FIELD OF THE DISCLOSURE

The present disclosure relates to electronic devices and processes of forming electronic devices, and more particularly to, electronic devices including trenches and conductive structures therein and processes of forming the same.

RELATED ART

A quasi-vertical diffused metal-oxide-semiconductor field-effect (VDMOS) transistor is a particular type of power transistor. The VDMOS transistor has a source region located above a buried doped region that acts as a drain region. Typically, many VDMOS transistors within an electronic device are connected in parallel to provide an effective channel length designed to support the current flow designed for the electronic device. Power transistors can include contacts on both sides of a chip. The maximum operating voltage may be limited by physical constraints. Many power transistors operate at voltage differences between the contacts (e.g., between a source contact and a drain contact) of no more than 40 to 50 V. Higher voltage differences may be used, but the lateral dimensions of the power transistors typically increase to keep the electrical field from reaching a level that would cause a junction breakdown, which is undesired. In addition, increasing the lateral dimension will cause the power transistors to consume more area, and as a result, increase manufacturing costs of the devices that include the power transistors.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Figure 1:
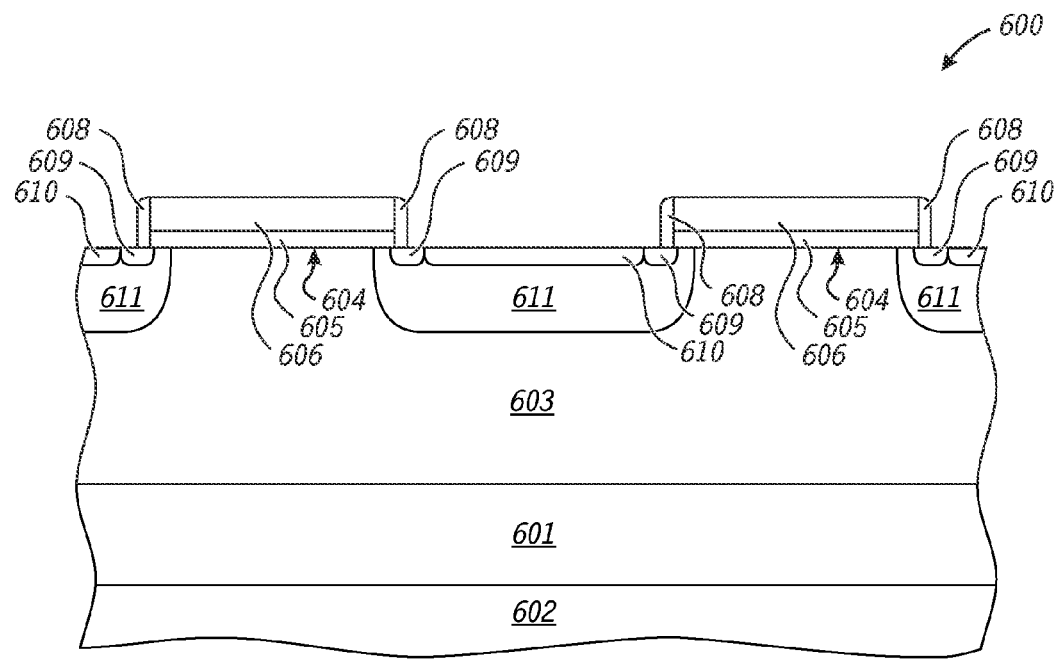
FIG. 1 includes an illustration of a cross-sectional view of a portion of a workpiece that includes doped regions, a gate dielectric layer, and gate electrodes.

FIG. 1 includes an illustration of a cross-sectional view of a portion of a workpiece 600. The workpiece includes a substrate 602 that is lightly doped or heavily doped, n-type or p-type. For the purposes of this specification, heavily doped is intended to mean a peak dopant concentration of at least $10^{19}$ atoms/cm$^3$, and lightly doped is intended to mean a peak dopant concentration of less than $10^{19}$ atoms/cm$^3$. In a particular embodiment, the substrate 602 can include a lightly doped portion overlying a heavily doped portion. A buried doped region 601 overlies the substrate 602. In an embodiment, the buried doped region 601 is heavily doped with an n-type dopant, such as phosphorus, arsenic, antimony, or any combination thereof. In a particular embodiment, the buried doped region 601 includes arsenic or antimony if diffusion of the buried doped region 601 is to be kept low, and in a particular embodiment, the buried doped region 601 includes antimony to reduce the level of outgassing (as compared to arsenic) during forming of a semiconductor layer 603.

The semiconductor layer 603 overlies the buried doped region 601. The semiconductor layer 603 has the same conductivity type as the buried doped region 601 but is lightly doped. The semiconductor layer 603 can include a Group 14 element (i.e., carbon, silicon, or germanium) and any of the dopants as described with respect to the buried doped region 603. In a particular embodiment, the semiconductor layer 603 is a lightly doped n-type epitaxial silicon layer having a thickness in a range of approximately 2 to approximately 15 microns and a peak doping concentration in a range of approximately $10^{15}$ atoms/cm$^3$ to approximately $10^{17}$ atoms/cm$^3$.

Spaced-apart well regions 611 lie adjacent to a primary surface 604 of the semiconductor layer 603. The well regions 611 can also be referred to as body regions. Portions of the well regions 611 will be channel regions of subsequently formed field-effect transistors. The well regions 611 have a conductivity type opposite that of the buried doped region 601 and the semiconductor layer 603. In a particular embodiment, each of the well regions 611 has a depth in a range of approximately 0.2 microns to approximately 3 microns and is doped with boron at a peak dopant concentration in a range of approximately $10^{16}$ atoms/cm$^3$ to approximately $10^{18}$ atoms/cm$^3$.

Source regions 609 and well contact regions 610 lie adjacent to the primary surface 604 of the semiconductor layer 603. The well contact regions 610 allow ohmic contacts to be formed to subsequently-formed metal-containing interconnects (not illustrated in FIG. 1). The source regions 609 have a conductivity type opposite that of the well regions 611, and the well contact region 610 has a conductivity type that is the same as the well regions 611. In a particular embodiment, each of the source regions 609 and well contact regions 610 has a depth in a range of approximately 0.05 microns to approximately 0.5 microns and are heavily doped. The source regions 609 can include any of the dopants described with respect to the buried doped region 601, and the well contact regions can include boron.

A gate dielectric layer 605 overlies the primary surface 604 of the semiconductor layer 603, and gate electrodes 606 overlie the gate dielectric layer 605. More particularly, the gate electrodes 606 overlie portions of the semiconductor layer 603, the well regions 611 and the source regions 609. The portions of the well regions 611 that underlie the gate electrodes 606 are channel regions for the field-effect transistors. The gate dielectric layer can include an oxide, a nitride, an oxynitride or any combination thereof, and the gate electrodes 606 include a conductive layer. The conductive layer can include a heavily doped semiconductor material, a metal-containing material, or any combination thereof. In a particular embodiment, the gate dielectric layer includes silicon dioxide and has a thickness in a range of approximately 5 nm to approximately 100 nm, and the gate electrodes 606 include heavily doped polycrystalline silicon and an overlying metal-silicide and have a thickness in a range of approximately 50 nm to approximately 500 nm. Sidewall spacers 608 lie adjacent to sides of the gate electrodes 606 and gate dielectric layer 605. The sidewall spacers 608 can include an oxide, a nitride, an oxynitride, or any combination thereof.

While many details have been given with respect to particular dopants, depths, thicknesses, and concentrations with respect to the embodiment as illustrated in FIG. 1, such details are used to describe potential non-limiting embodiments and not to limit the scope of the present invention.

Figure 2:
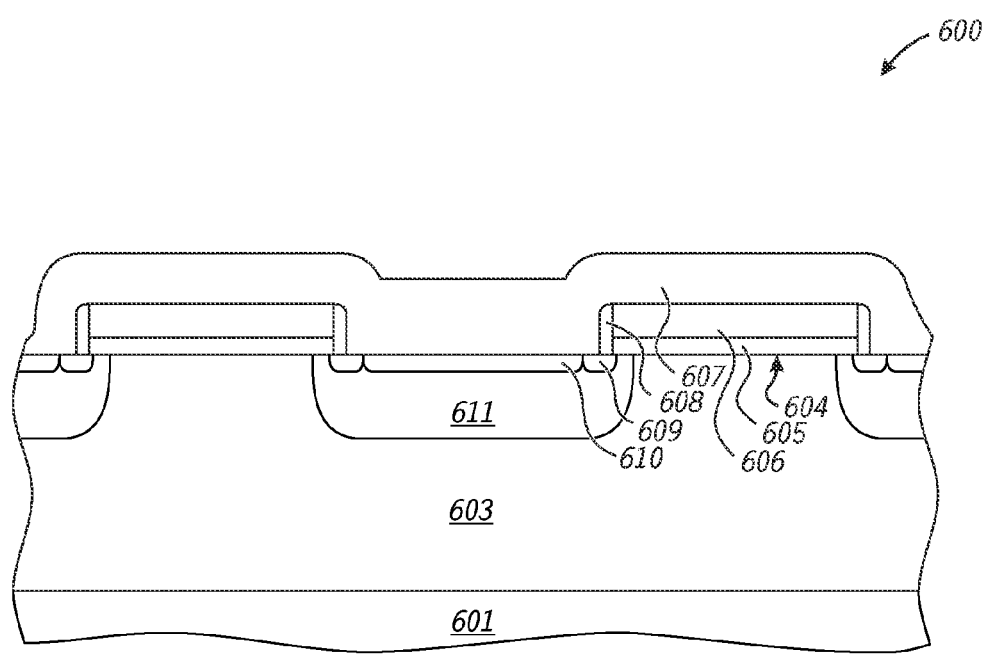
FIG. 2 includes an illustration of a cross-sectional view of a portion of the workpiece of FIG. 1 after forming an insulating layer over the exposed surface of the workpiece.

An insulating layer 607 is formed over the gate electrodes 606 and other portions of the workpiece, as illustrated in FIG. 2. The insulating layer 607 can include an oxide, a nitride, an oxynitride, or any combination thereof. In a particular embodiment, the insulating layer 607 is formed by depositing a silicon dioxide layer to a thickness in a range of approximately 500 nm to approximately 1500 nm.

Figure 3:
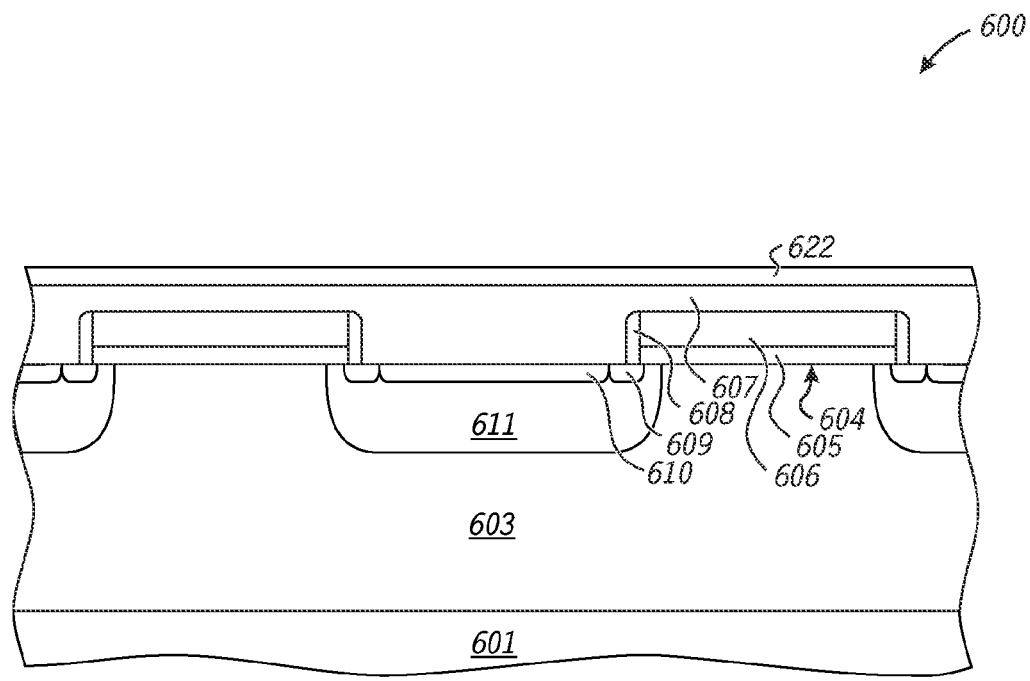
FIG. 3 includes an illustration of a cross-sectional view of a portion of the workpiece of FIG. 2 after planarizing the insulating layer and forming another insulating layer over the planarized surface.

The insulating layer 607 is planarized, and another insulating layer 622 is formed over the insulating layer 607 after planarization, as illustrated in FIG. 3. The planarization allows subsequent lithographic operations, such as patterning a resist layer, to be performed more easily. The planarization can be performed using chemical-mechanical polishing, a resist-etch back, or other similar technique. The insulating layer 622 can include an oxide, a nitride, an oxynitride, or any combination thereof. The composition of the insulating layer 622 can be different from the insulating layer 607, so that the insulating layer 622 acts as a polish-stop layer, an etch-stop layer, an antireflective layer, serve another useful purpose, or any combination thereof. In a particular embodiment, the insulating layer 622 is formed by depositing silicon nitride to a thickness in a range of approximately 20 nm to approximately 600 nm. The planarization of the insulating layer 607 and formation of the insulating layer 622 are optional; however, they help to make the process more reproducible.

Figure 4:
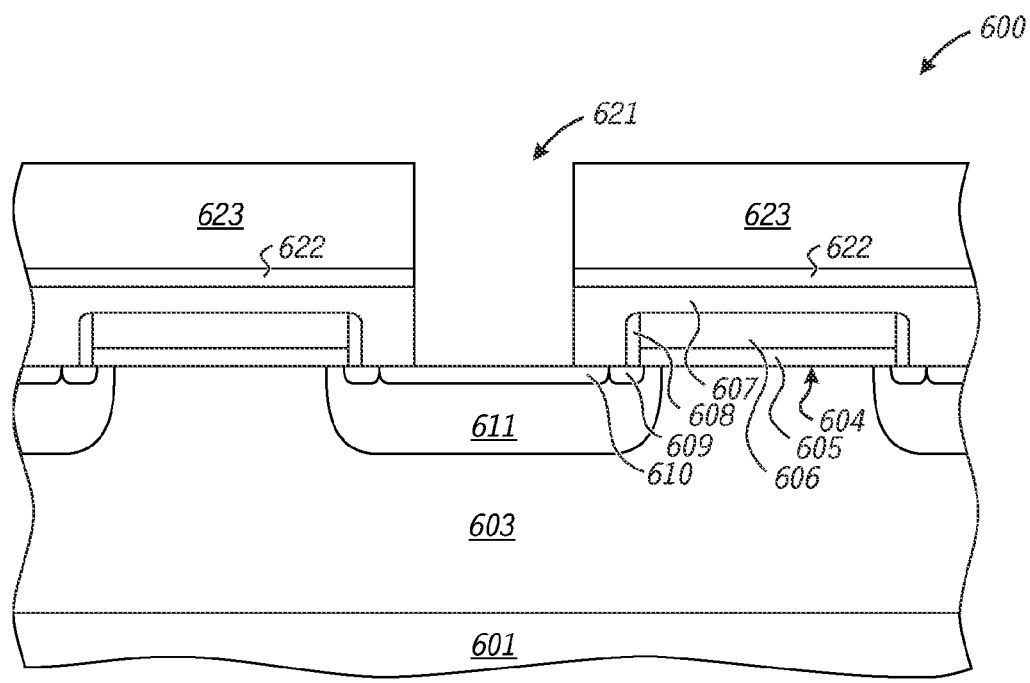
FIG. 4 includes an illustration of a cross-sectional view of a portion of the workpiece of FIG. 3 after forming a patterned resist layer over the insulating layers and removing portions of the insulating layers underlying an opening in the patterned resist layer.

A resist layer 623 is coated over the insulating layer 622 and patterned to define openings, such as opening 621, over the well contact regions 610, as illustrated in FIG. 4. The insulating layers, such as insulating layers 607 and 622, underlying the openings in the resist layer 623 are removed to expose the well contact regions 610.

Figure 5:
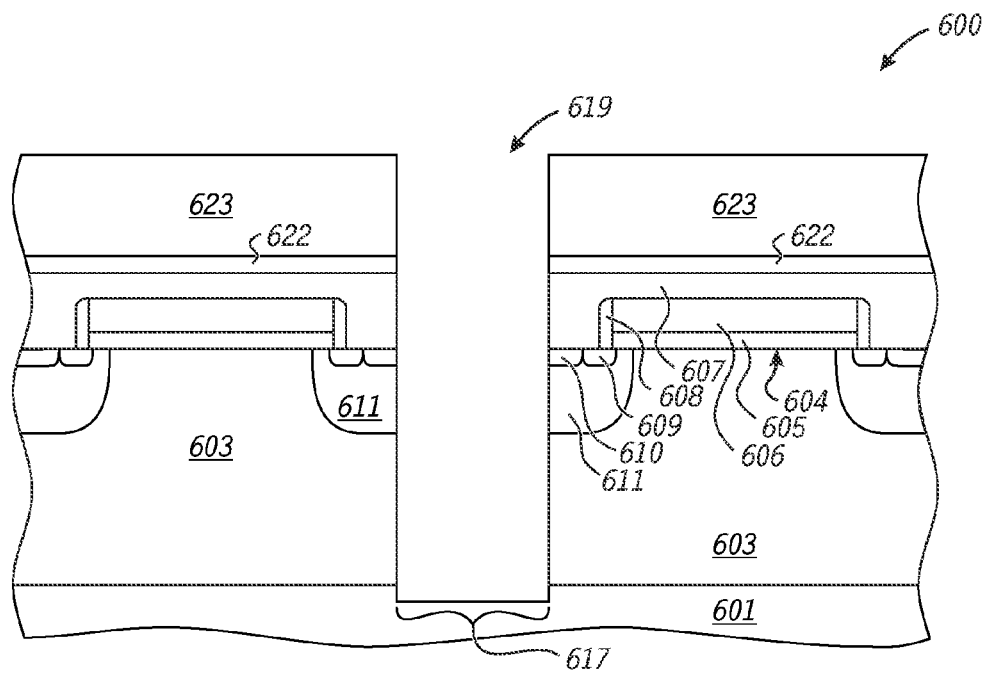
FIG. 5 includes an illustration of a cross-sectional view of a portion of the workpiece of FIG. 4 after forming a trench extending through a semiconductor layer to a buried doped region.

Referring to FIG. 5, portion of the well contact regions 610, the well regions 611, and semiconductor layer 603 that underlie the openings in the resist layer 623 are removed to form trenches that extend from the primary surface 604 towards the buried doped region 601, as illustrated in FIG. 5. Although FIG. 5 illustrates only one trench 619, other trenches (not illustrated) are present and substantially similar to the trench 619. The width of the trench 619 is sufficiently wide enough to allow a doped region to be subsequently formed along the sidewall 614 of the trench 619 at a depth deeper than the well region 611. The width of the trench 619 is not so wide that a subsequently-formed conductive layer is incapable of filling the trench 619 after intervening processing is performed. In a particular embodiment, the width of each trench 619 is at least approximately 0.5 micron, and in another particular embodiment, the width of each trench 619 is no greater than approximately 4 microns or approximately 2 microns. After reading this specification, skilled artisans will appreciate that narrower or wider widths outside the particular dimensions described may be used. The trenches 619 can extend to the buried doped region 601; however, the trenches 619 may be shallower if needed or desired.

The trenches are formed using an anisotropic etch. In an embodiment, a timed etch can be performed, and in another embodiment, a combination of endpoint detection (e.g., detecting the dopant species from the buried doped region, such as arsenic or antimony) and a timed overetch may be used.

Figure 6:
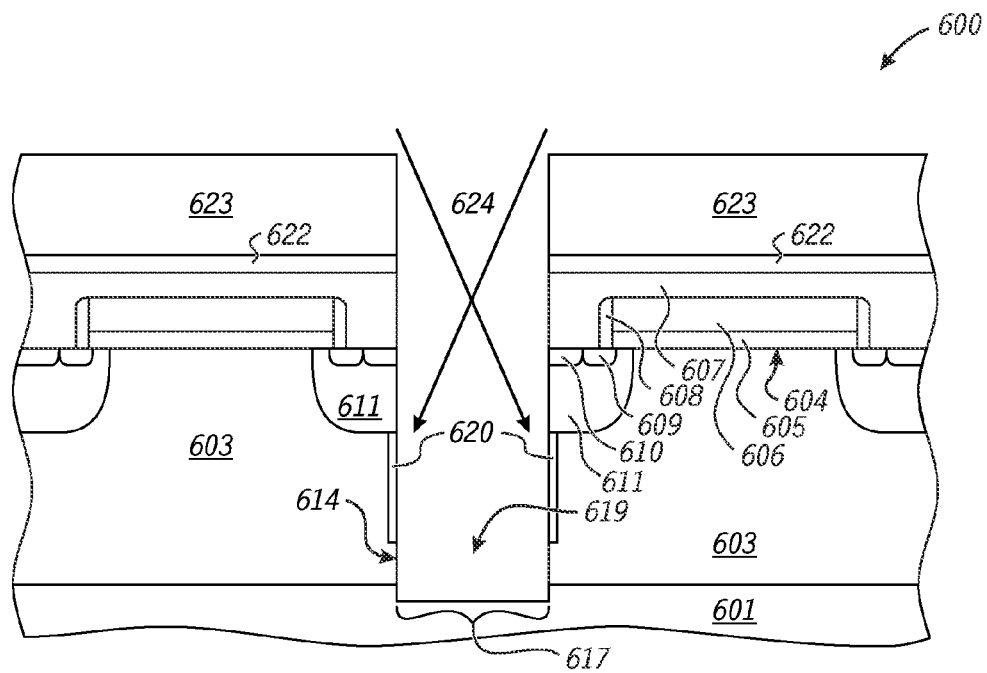
FIG. 6 includes an illustration of a cross-sectional view of a portion of the workpiece of FIG. 5 during a tilt angle ion implant.

Doped regions are formed along the sidewalls of the trenches. Referring to FIG. 6, the doped region 620 is formed from a portion of the semiconductor layer 603 lying along the sidewall 614 of the trench 619. The doped region 620 are formed by ion implanting a dopant using a tilt angle implant technique, which is depicted by arrows 624 in the embodiment as illustrated in FIG. 6. As used herein the angle of the implant is measured from a plane substantially perpendicular to the primary surface 604 (i.e., from vertical as illustrated in FIG. 6). The angle is large enough to allow a sufficient amount of dopant to be implanted along the sidewall 614 of the trench 619, and is small enough such that the doped region 620 is formed deeper into the semiconductor layer 603 as compared to the well regions 611. In an embodiment, the angle for the tilt angle implant is at least approximately 8° or approximately 15°, and in another embodiment, the angle for the tilt angle implant is no greater than approximately 50° or approximately 40°. In a particular embodiment, the angle for the tilt angle implant is in a range of approximately 20° to approximately 35°. In an embodiment where $B^{11}$ is the implanting species, the energy is at least approximately 50 keV or approximately 90 keV, and in another embodiment, the energy is no greater than approximately 500 keV or approximately 400 keV. In a particular embodiment, the energy is in a range of approximately 200 keV to approximately 250 keV. In an embodiment, the dose is at least approximately $5 \times 10^{11}$ ions/cm$^2$ or approximately $1 \times 10^{12}$ ions/cm$^2$, and in another embodiment, the dose is no greater than approximately $5 \times 10^{13}$ ions/cm$^2$ or approximately $1 \times 10^{13}$ ions/cm$^2$. In a particular embodiment, the dose is in a range of approximately $2 \times 10^{12}$ ions/cm$^2$ to approximately $5 \times 10^{12}$ ions/cm$^2$.

After reading this specification, skilled artisans will appreciate that the thicknesses of layers overlying the primary surface 604 of the semiconductor layer 603 may also affect how deep the ions are implanted, in addition to the angle. If the resist layer 623 is removed before performing the ion implantation, the ions will be implanted into the semiconductor layer 603 at a depth lower into the trench 619. A lower energy during the ion implant may be used to reduce the likelihood that ions would pass through the gate electrodes 606 and affect the doping concentrations portions of the well regions 611 and semiconductor layer 603 near the primary surface 604. Because a lower energy ion implant may be used, subsequent thermal cycle(s) may or may not need to be adjusted to achieve a desired doping profile and meet an electrical performance criterion (e.g., an electrical field profile that reduces the likelihood of premature junction breakdown). Skilled artisans will appreciate that the thermal budget with respect to other doped regions (e.g., the well regions 611, source regions 609, etc.) also will be considered to ensure the proper electronic performance of the electronic device being formed.

Many details regarding the implant parameters and related considerations are described. After reading this specification, skilled artisans will appreciate that values less than and greater than described may be used in other particular applications. Thus, implant parameters other than those disclosed may be used without departing from the scope of the present invention. Other doping techniques may be used and are described later in this specification.

Figure 7:
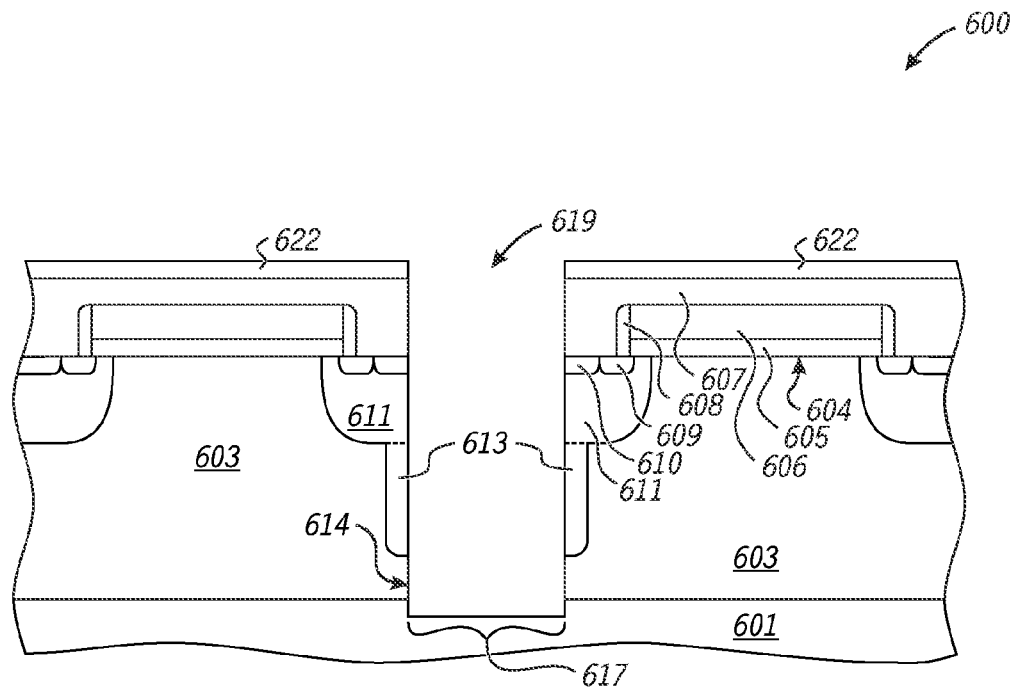
FIG. 7 includes an illustration of a cross-sectional view of a portion of the workpiece of FIG. 6 after activating dopant from the ion implant to form a sidewall doped region within the semiconductor layer.

The resist layer 623 is removed, if it has not previously been removed, and dopant from the doped regions is activated to form sidewall doped regions, such as sidewall doped region 613 as illustrated in FIG. 7. The dopant may be driven further into the semiconductor layer 603, if needed or desired. The dopant activation and optional dopant drive may occur through heat cycles during subsequent processing or may be performed using a separate heat cycle. As illustrated in the embodiment of FIG. 7, a combination of the well region 611 and sidewall doped region 613 extends along a majority of the sidewall of the trench 619. In another embodiment, the sidewall doped region 613 can extend to the buried doped region 601. The sidewall doped region 613 has the same conductivity type as the well region 611 and can have any of the dopant concentrations as previously described with respect to the well region 611. The sidewall doped region 613 may have the same or different dopant concentration as compared to the well region 611.

Note that the dopant concentration within the sidewall doped region 613 has a substantially uniform concentration along the sidewall 614 of the trench 619 at locations where ions were implanted into the semiconductor layer 603. Thus, the dopant concentration within the sidewall doped region 613 decreases as a function of the distance from the sidewall 614, whereas the dopant concentration within the well region 611 decreases as a function of the distance from the primary surface 604. The relatively more uniform dopant concentration of the sidewall doped region 613 along the depth of the trench 619 helps increase the breakdown voltage between the source and drain of a power transistor being formed. Such a benefit will be described in more detail later in this specification.

Figure 8:
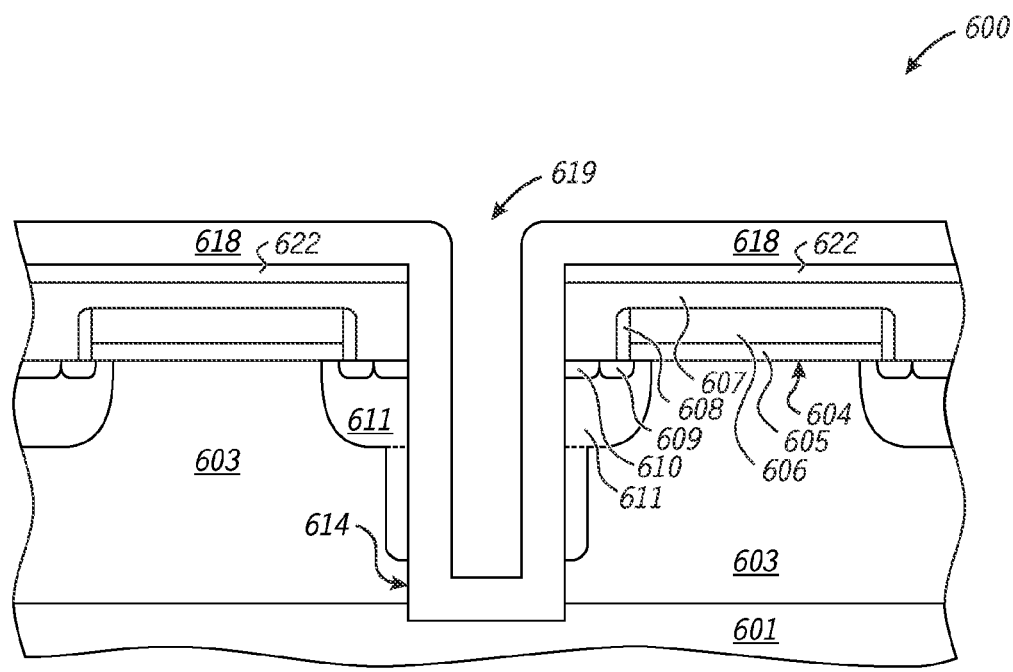
FIG. 8 includes an illustration of a cross-sectional view of a portion of the workpiece of FIG. 7 after forming an insulating layer that partially fills the trench.
Figure 9:
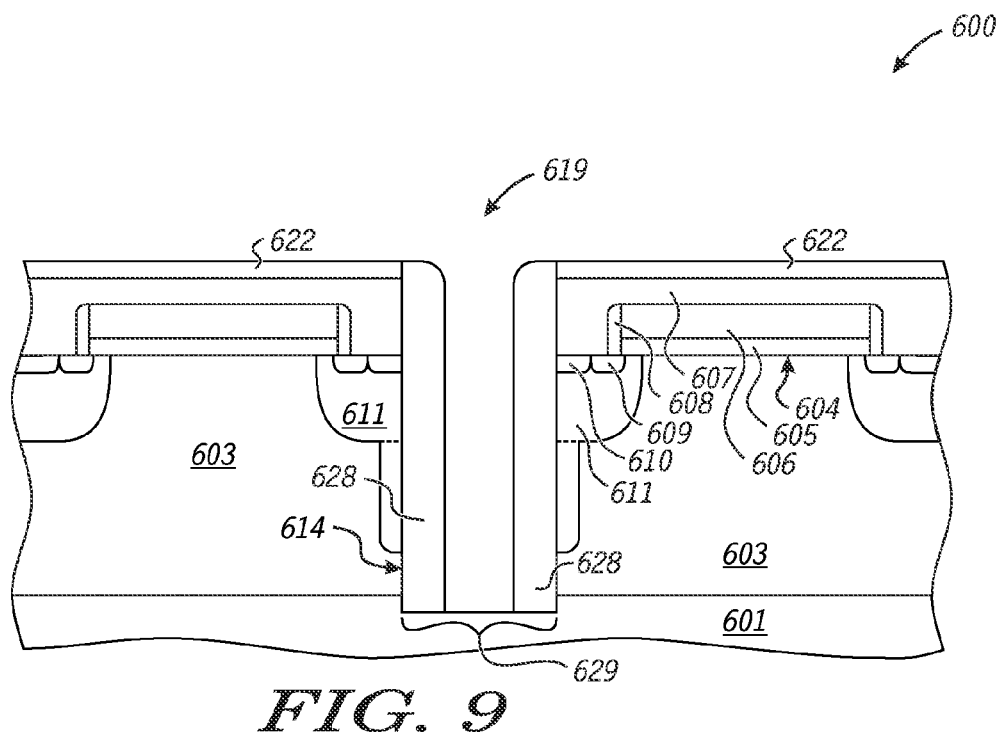
FIG. 9 includes an illustration of a cross-sectional view of a portion of the workpiece of FIG. 8 after forming a sidewall spacer and exposing a portion of the buried doped region.

Sidewall spacers are formed along the sidewalls of the trenches, such as in the embodiment as illustrated in FIGS. 8 and 9. An insulating layer 618 is formed over the primary surface 604 and along the sidewall 614 and bottom of the trench 619. The insulating layer 618 is sufficiently thick to substantially prevent a premature breakdown between a subsequently-formed conductive structure that will lie within the trench 619 and either or both of the sidewall doped region 613 and the well region 611. The insulating layer 618 partially, but does not completely, fills the trench 619. In a particular embodiment, the insulating layer 618 has a thickness in a range of approximately 500 nm to approximately 1500 nm. The insulating layer 618 includes an oxide, a nitride, an oxynitride, or any combination thereof. The insulating layer 618 can have a composition different from the insulating layer 622. In a particular embodiment, the insulating layer 618 is formed by depositing silicon dioxide to a thickness in a range of approximately 300 to 1500 nm The insulating layer 618 is anisotropically etched to form the sidewall spacers, such as sidewall spacer 628 in FIG. 9. The insulating layer 622 helps to reduce excessive etching or other etch damage to underlying features, such as the gate electrodes 606, during the etch that forms the sidewall spacer 628. A portion 629 of the buried doped region 601 is exposed along the bottom of the trench 619.

Figure 10:
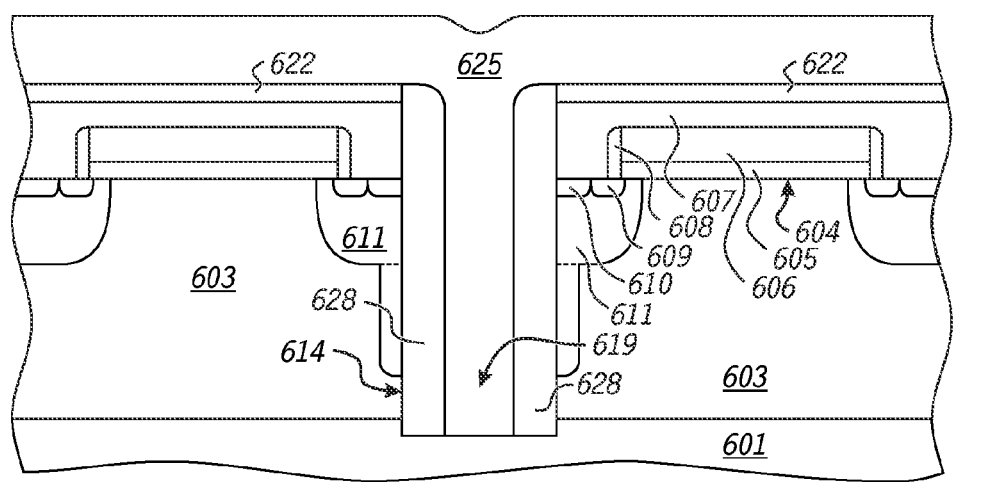
FIG. 10 includes an illustration of a cross-sectional view of a portion of the workpiece of FIG. 9 after forming a conductive layer that substantially fills a remaining portion of the trench.

A conductive layer 625 is formed over the primary surface 604, the sidewall spacer 628, and the buried doped region 601, as illustrated in FIG. 10. The conductive layer 625 substantially fills the remaining portion of the trench 619. The conductive layer 625 can include a metal-containing or semiconductor-containing material. In an embodiment, the conductive layer 625 includes a plurality of films, such as an adhesion film, a barrier film, and a conductive fill material. In a particular embodiment, the adhesion film can include a refractory metal, such at titanium, tantalum, or the like; the barrier film can include a refractory metal nitride, such as titanium nitride, tantalum nitride, or the like, or a refractory metal-semiconductor-nitride, such as TaSiN; and the conductive fill material can include tungsten. In a more particular embodiment, the conductive layer 625 can include Ti/TiN/W. Each of the titanium and titanium nitride films can be physically vapor deposited (e.g., sputtered) to a thickness in a range of approximately 20 nm to approximately 90 nm, and the tungsten film can be chemically vapor deposited to a thickness of approximately 50 nm to approximately 500 nm. In another embodiment, the conductive layer 625 can include a heavily doped semiconductor material. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity compared to heavily doped n-type silicon. After reading this specification, skilled artisans will be able to determine the composition of the conductive layer 625 to meet their needs or desires for a particular application.

Figure 11:
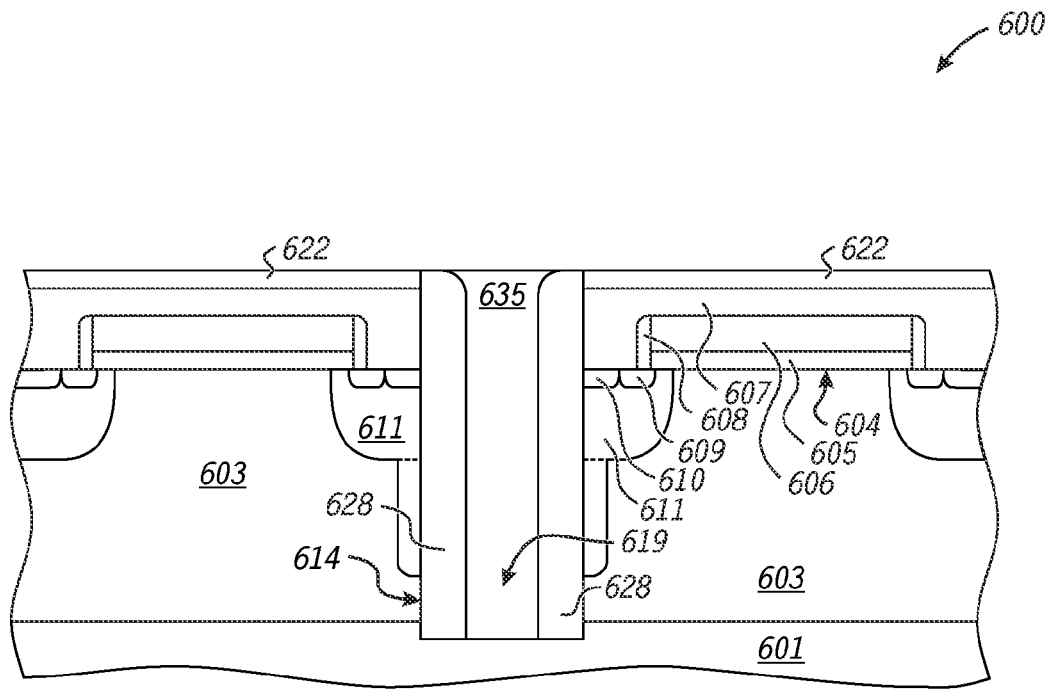
FIG. 11 includes an illustration of a cross-sectional view of a portion of the workpiece of FIG. 10 after removing a portion of the conductive layer lying outside the trench.

A portion of the conductive layer 625 that overlies the primary surface 604 is removed to form conductive structures within the trenches, such as conductive structure 635 within the trench 619 as illustrated in the embodiment of FIG. 11. The removal can be performed using a chemical-mechanical polishing or blanket etching technique. The insulating layer 622 may be used as a polish-stop or etch-stop layer. Polishing or etching may be continued for a relatively short time after the insulating layer 622 is reached to account for a non-uniformity across the workpiece with respect to the thickness of the conductive layer 625, the polishing or etching operation, or any combination thereof.

Figure 12:
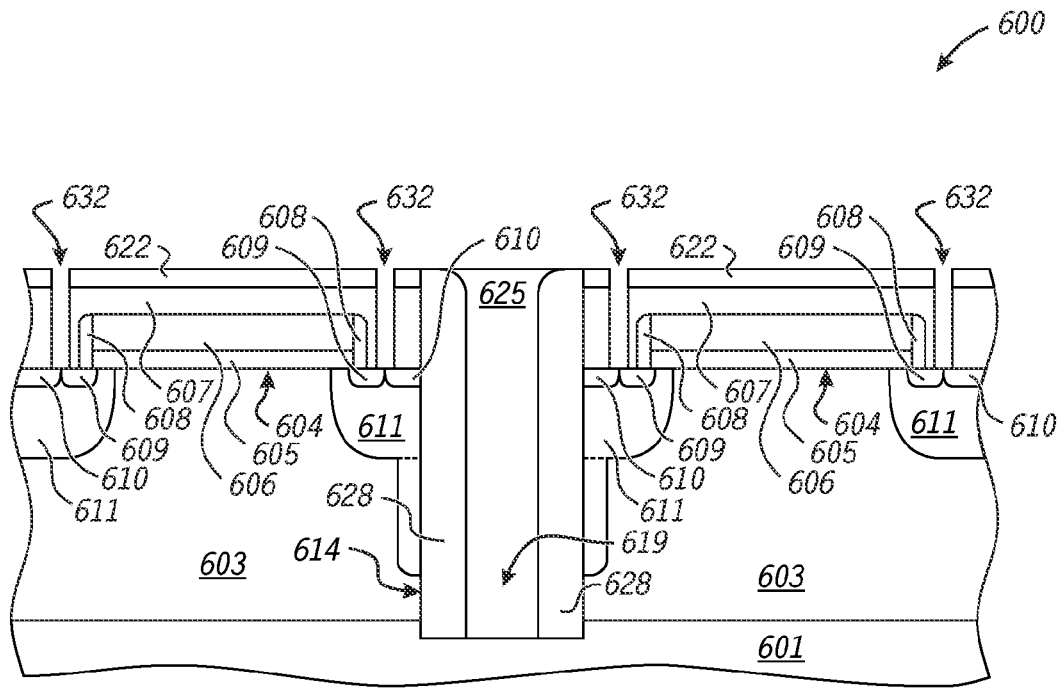
FIG. 12 includes an illustration of a cross-sectional view of a portion of the workpiece of FIG. 11 after forming contact openings.
Figure 13:
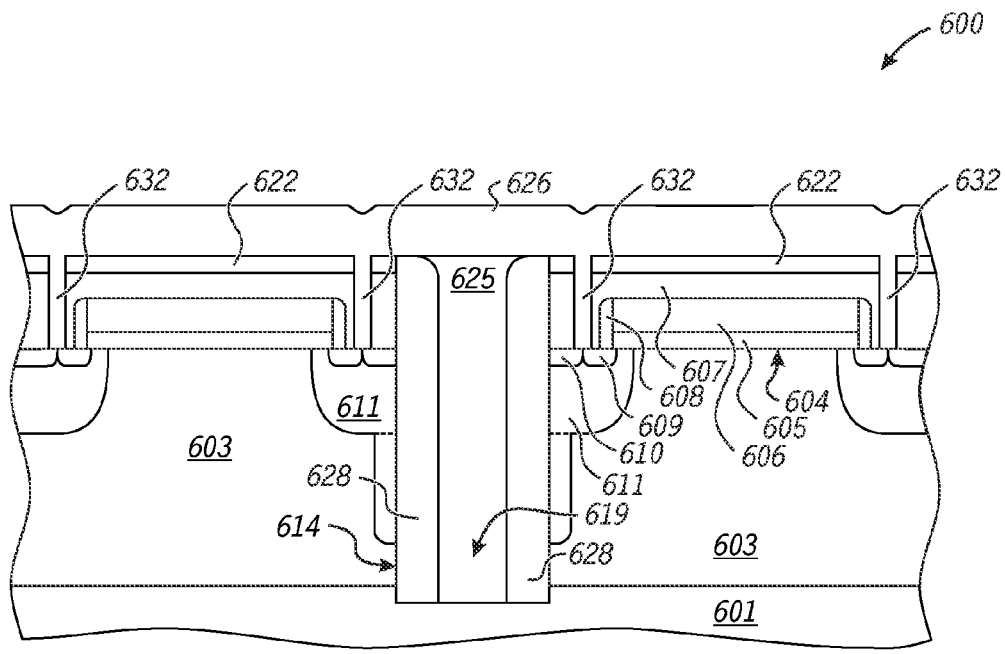
FIG. 13 includes an illustration of a cross-sectional view of a portion of the workpiece of FIG. 12 after forming a conductive layer within the contact openings.
Figure 14:
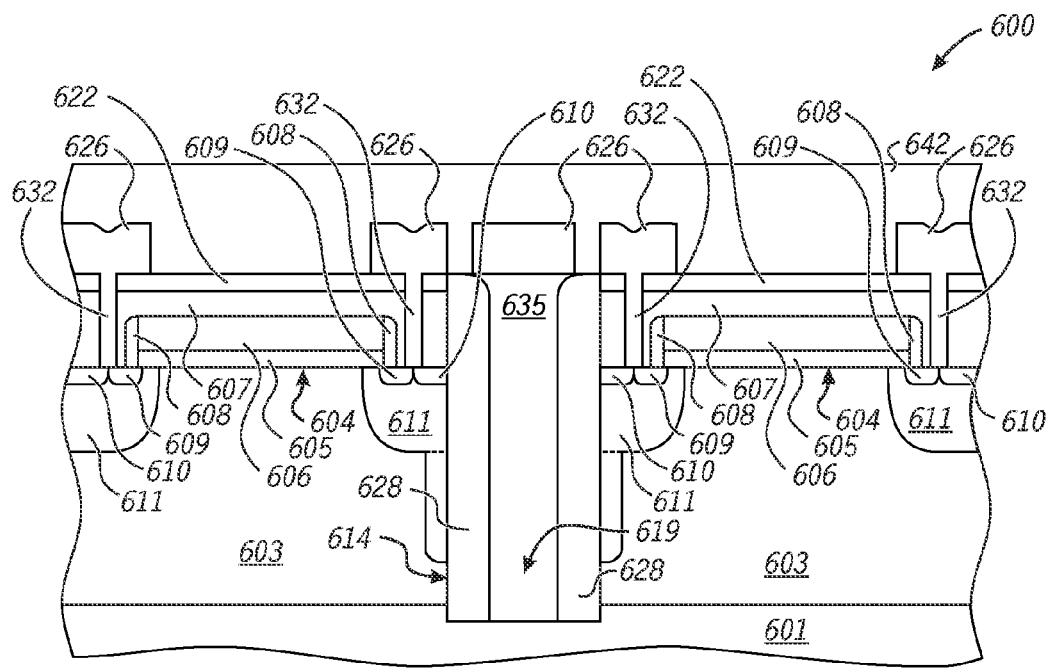
FIG. 14 includes an illustration of a cross-sectional view of a portion of the workpiece of FIG. 13 after forming a substantially completed electronic device in accordance with the present invention.
Figure 15:
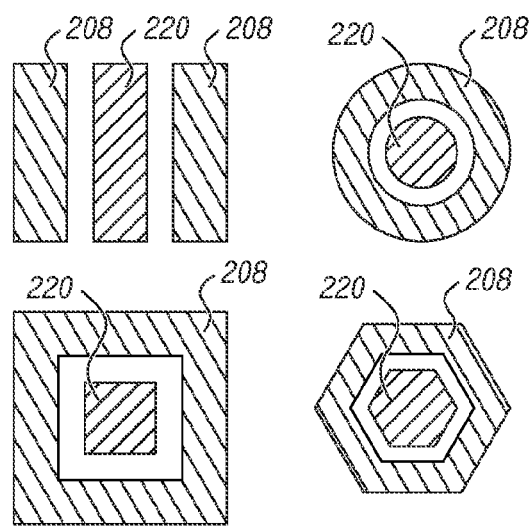
FIG. 15 includes an illustration of top views that illustration different exemplary interconnect layouts that can be used with the electronic device.

Contact openings 632 are formed that extend to the source regions 609 and well contact regions 610, as illustrated in FIG. 12. Other contact openings (not illustrated) can be formed to other portions of the electronic device (e.g., the gate electrodes 606) but are not illustrated in FIG. 12. A conductive layer 626 is formed along the exposed surface of the workpiece and within the contact openings 632, as illustrated in FIG. 13. Similar to the conductive layer 625 for the conductive structure 635, the conductive layer 625 can include a single film or a plurality of films. The conductive layer 625 has a bulk resistivity significantly lower than heavily doped n-type silicon. Exemplary materials include aluminum, tungsten, copper, gold, or the like. The conductive layer 625 can be patterned to form interconnects 626, as illustrated in FIG. 14. A subsequent passivation layer 642 is formed over the interconnects 626 and other exposed portions of the workpiece to form a substantially completed electronic device. FIG. 15 includes an illustration of top views of some exemplary, non-limiting arrangements for the interconnects to the conductive structure and the nearest source and well contact regions. After reading this specification, skilled artisans will appreciate that other layouts of the interconnects may be used.

Figure 16:
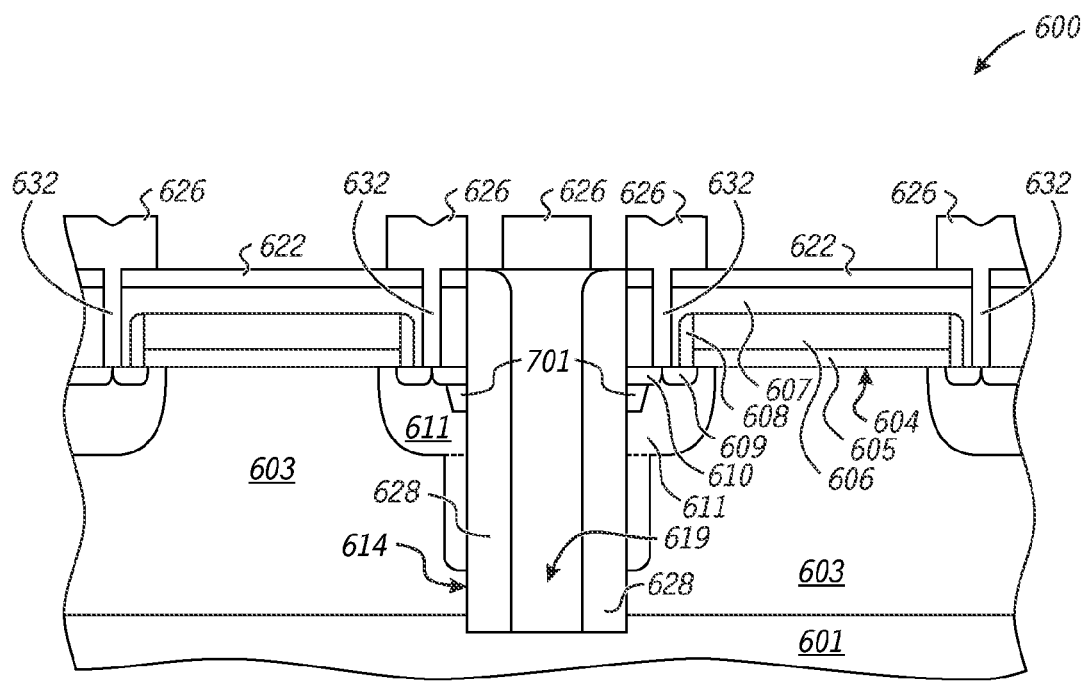
FIG. 16 includes an illustration of a cross-sectional view of a portion of a workpiece in accordance with an alternative embodiment that includes a field isolation region adjacent to the trench.

In another embodiment, the electronic device can include field isolation regions that are used in conjunction with a power transistor. Referring to FIG. 16, field isolation region 701 is formed adjacent to the primary surface 604 and the trench 619. With respect to the process flow, the field isolation regions may be formed after forming the well regions 611 and before forming the gate dielectric layer 605, the gate electrodes 606, the source regions 609, the well contact regions 609, and the trench 619. During the etch to form the trench 619, some of the insulating material within the field isolation region 701 is removed before the semiconductor layer 603 is etched. The field isolation region 701 can help to reduce the electrical field between conductive structure 635 and either or both of the well region 611 and well contact region 610.

Figure 17:
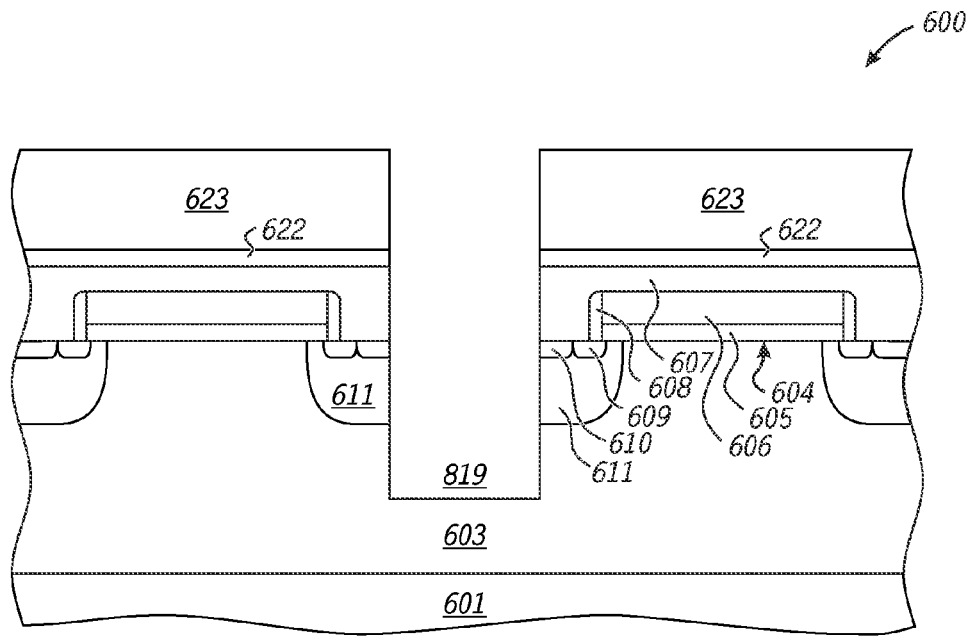
FIGS. 17 to 19 include illustrations of cross-sectional views of a portion of the workpiece of FIG. 4 during trench formation and sidewall doping in accordance with an alternative embodiment.
Figure 18:
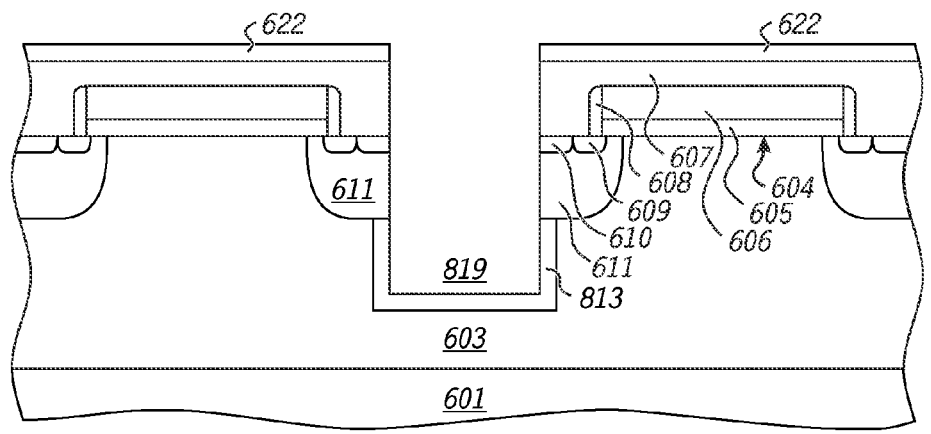

In still other embodiments, the trenches can be a different depth, a different doping technique may be used, or a combination thereof. After forming the workpiece as illustrated in FIG. 4, the semiconductor layer 603 may be etched such that the trench 819 extends into the semiconductor layer 603 only partially, but not completely, to the buried doped region 601, as illustrated in FIG. 17. The resist layer 623 can then be removed. A gaseous or solid doping source is used to dope the exposed portions of the semiconductor layer 603 to forming the doped region 813, as illustrated in FIG. 18. The doped region 813 can be formed using a tilt angle implant similar to embodiments previously described, a doping gas or a solid doping source. If a p-type dopant is used, the doping gas can include diborane, a boron halide, or the like, and if an n-type dopant is used, the doping gas can include phosphine, phosphorous oxychloride, arsine, or the like. In another embodiment, doping gas can be outgassed from a solid source, such as boron nitride, aluminum arsenate, $NH_4H_2PO_4$, an antimony oxide, or the like. Alternatively, a doped glass or doped semiconductor layer (e.g., doped silicon layer) can be formed along exposed portions of the trench 819. A subsequent cycle actives and drives the dopant into the semiconductor layer 603 to form a sidewall doped region. Similar to the ion implantation embodiment, a relatively uniform doping concentration may be achieved along the sidewall of the trench, wherein the doping concentration decreases as a function of the distance from the sidewall of the trench. After the doping cycle, the doped glass or doped semiconductor layer may or may not be removed before subsequent processing continues.

Figure 19:
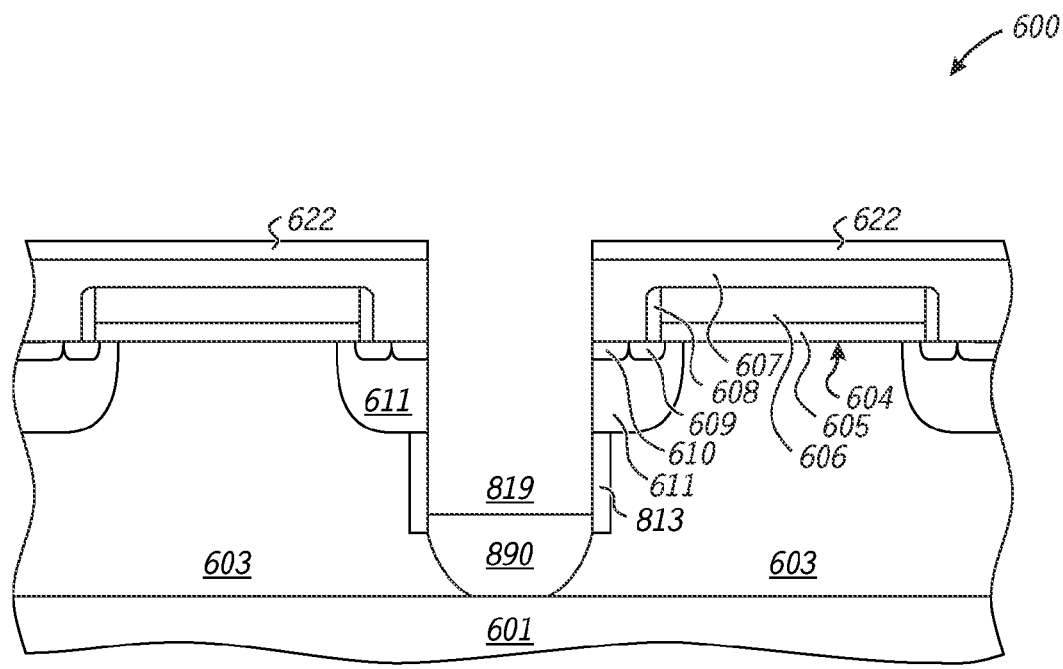

A portion of the semiconductor layer 603 can be doped by ion implantation to form the doped region 890 that extends between the bottom of the trench 819 to the buried doped region 601, as illustrated in FIG. 19. The doped region 890 has the same conductivity as that of the buried doped region 601 and can be heavily doped. In a further embodiment, another etching operation can be performed to extend the trench 819 until the buried doped region 601 is exposed, similar to the workpiece as illustrated in FIG. 7. In theory, the trench does not have to extend completely to the buried doped region 601; however, the breakdown voltage or other electronic performance may be compromised if a portion of the semiconductor layer 603 lies between the bottom of the trench and the doped buried layer 601.

In a further embodiment, the conductivity types of the buried doped region 601, semiconductor layer 603, source regions 609, well contact regions 610, and sidewall doped region 613 can be reversed. Dopant concentrations and other parameters (thicknesses, junction depths, etc.) may be adjusted to achieve a needed or desired electronic performance.

In the embodiments described above, the electronic device includes a power transistor, and more particularly, a VDMOS transistor. The electronic device can include other VDMOS transistors (not illustrated) that are different or substantially identical to the VDMOS transistor as illustrated in FIG. 14. The VDMOS transistors can be electrically connected or otherwise coupled in parallel to achieve the desired current through the electronic device.

Referring to FIG. 14, the sidewall doped region 613 helps to make a more uniform electrical field along the sidewall of the trench when the transistor is operating. The more uniform electrical field allows for a higher breakdown voltage between the source and drain of the transistor (also referred to as $BV_{DSS}$). The higher breakdown voltage allows the power transistor to be operated at higher voltages. For example, $BV_{DSS}$ for the power transistor as illustrated in FIG. 14 can be approximately 120 V, whereas if the sidewall doped region 613 would not be present, $BV_{DSS}$ for the power transistor may be approximately 70 V. Thus, the power transistor as illustrated in FIG. 14 can have an operating voltage of at least approximately 100 V because the power transistor can be operated at a voltage difference between the interconnects for the source region 609 and the conductive structure 635 of at least approximately 100 V. If the sidewall doped region 613 would not be present, such a high voltage difference could not be achieved without a breakdown. For the purposes of this specification, an operating voltage of a transistor is the highest designed potential between any terminals of the transistor (e.g., source, drain, and gate) during normal operation of the transistor.

The dopant concentration profile of the sidewall doped region 613 is achieved by introducing dopant into the semiconductor layer 603 along the sidewall 620 of the trench 619, as opposed to introducing the dopant along the primary surface 604 of the semiconductor layer 603. If the dopant for the sidewall doped region were diffused from the primary surface 604 (similar to forming a deep collector), the dopant profiles of previously doped portions of the workpiece, such as well regions 611 or the buried doped region 601, may be adversely affected by such a long dopant drive cycle needed to diffuse the dopant to the proper depth. Also, the diffusion may require significantly greater lateral spacing since the diffusion would occur in nearly all directions (laterally and vertically) within the semiconductor layer 603.

Thus, the sidewall doped region 613, sidewall spacer 628, and conductive structure 635 in accordance with an embodiment of the present invention allow a relatively smaller power transistor to be formed and still allow for operation at source-to-drain voltage differences of higher than 50 volts, and in particular embodiments, higher than 100 volts.

Figure 20:
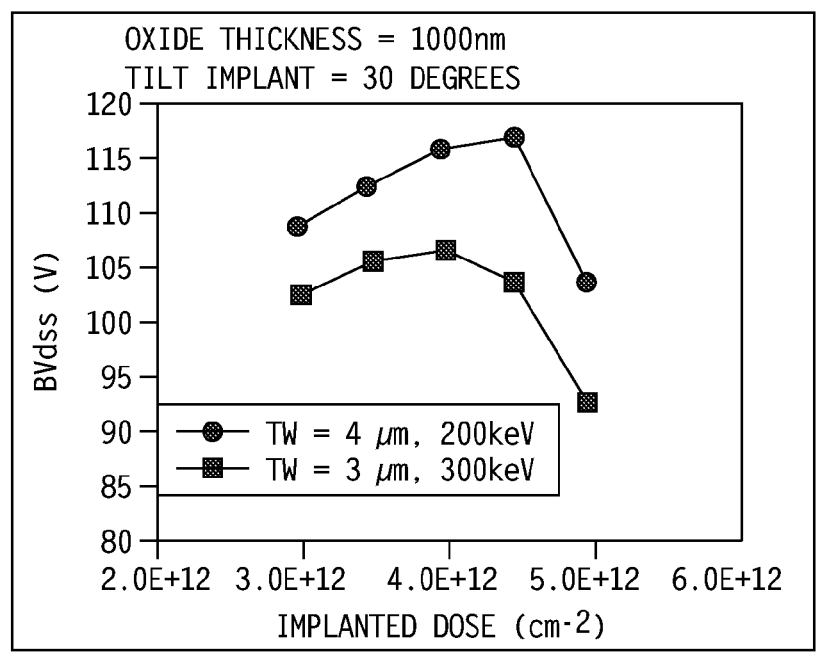
FIGS. 20 to 22 include plots that illustrate the impact of fabrication parameters affect the source-to-drain breakdown voltage.
Figure 21:
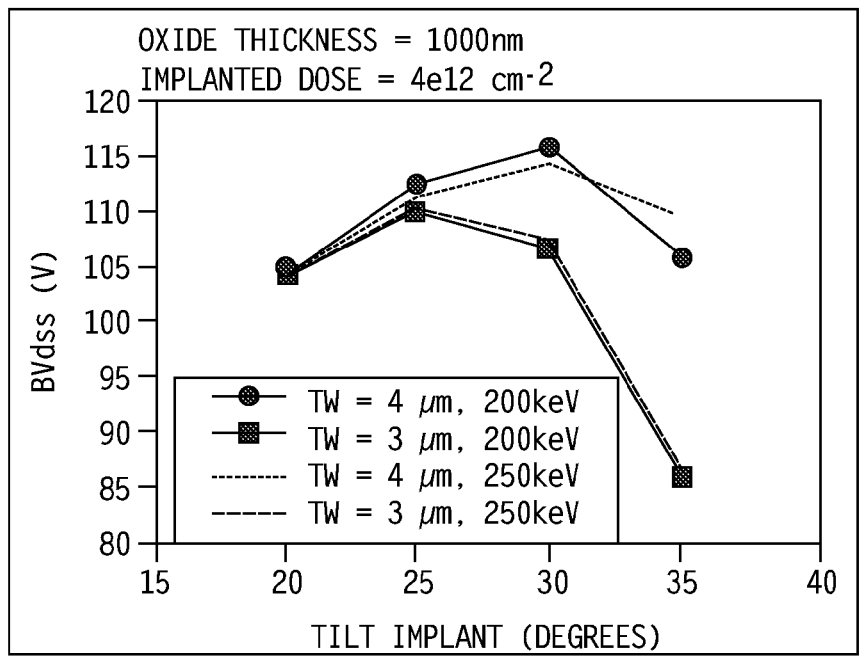
Figure 22:
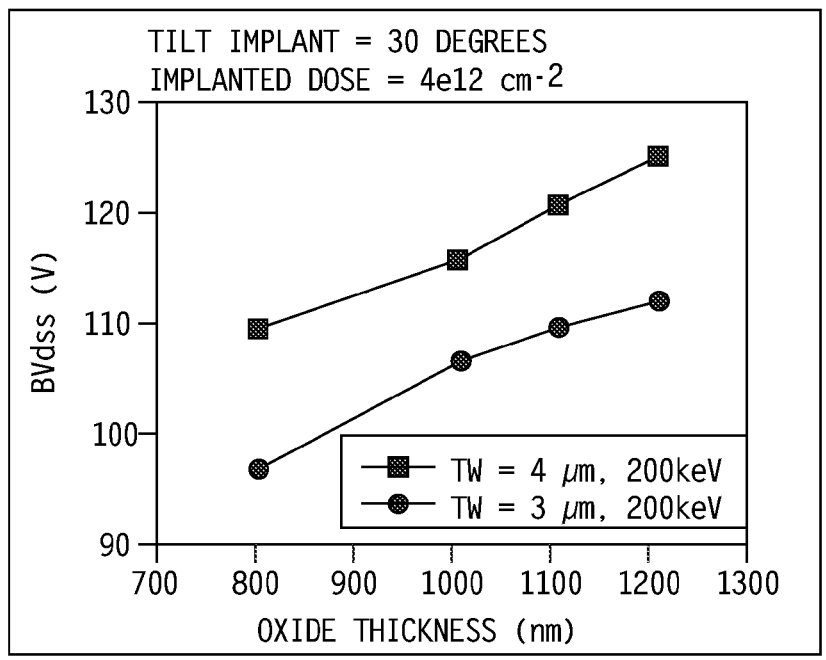

FIGS. 20 to 22 illustrate how the breakdown voltage varies when each of the implanted dose for the doped region 620, the tilt angle, and sidewall spacer 628 thickness near the bottom of the trench 619 is varied. In the embodiments described with respect to FIGS. 20 to 22, the semiconductor layer 603 has a thickness of approximately 8.5 microns. Within the figures, Tw refers to the width of the trench 619, and oxide thickness refers to the thickness of the sidewall spacer 628 thickness near the bottom of the trench 619. In general, a higher $BV_{DSS}$ is achieved when the width of the trench 619 is 4 microns wide rather than 3 microns wide, and all other parameters are held constant. With respect to implant dose, a higher dose may be used as the width of the trench 619 becomes wider; however too much dose significantly reduces $BV_{DSS}$. Similarly, with respect to the angle for the implant (also called tilt angle), a higher angle may be used as the width of the trench 619 becomes wider; however at too high of an angle, $BV_{DSS}$ can be significantly reduced. As the thickness of the sidewall spacers 628 becomes thicker, $BV_{DSS}$ increases. The thickness generally corresponds to the thickness of the insulating layer 618 as formed. A thicker insulating layer 618, and hence, a thicker sidewall spacer 628 comes at the expense of a reduced width of the conductive structure 635 or a wider trench 619. The reduced width of the conductive structure 635 can increase the parasitic resistance through the power transistor, and a wider trench causes a larger area to be occupied by the power transistors. After reading this specification, skilled artisans will be able to determine the particular values of parameters that meets the needs or desires of a circuit designer for a particular electronic device.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include providing a workpiece including a first layer, a well region, and a buried doped region, wherein the first layer has a primary surface, the well region lies adjacent to the primary surface, and the buried doped region is spaced apart from the primary surface and the well region. The process can also include forming a trench extending towards the buried doped region, wherein a portion of the first layer lies along a sidewall of the trench. The process can further include doping the portion of the first layer along the sidewall of the trench to form a sidewall doped region, wherein dopant for the sidewall doped region is introduced into the first layer along the sidewall of the trench. The process can still further include forming a conductive structure within the trench, wherein the conductive structure is electrically connected to the buried doped region and is electrically insulated from the sidewall doped region.

In an embodiment of the first aspect, doping the portion of the first layer includes performing a tilt angle implant. In another embodiment, doping the portion of the first layer includes ion implanting a dopant at an angle of at least approximately 8°. In a further embodiment, doping the portion of the first layer along the sidewall of the trench is performed using a dopant having a conductivity type opposite that of the first layer.

In still another embodiment of the first aspect, the process further includes forming an insulating sidewall spacer along the sidewall of the trench before forming the conductive structure. In a particular embodiment, forming the conductive structure includes depositing a refractory metal-containing material overlying the primary surface and substantially filling a remainder of the trench, and polishing the refractory metal-containing material to remove a portion of the refractory metal-containing material that overlies the primary surface. In another particular embodiment, forming a first insulating layer over the primary surface before forming the trench, and forming a second insulating layer over the first insulating layer before forming the trench, wherein the second insulating layer has a different composition as compared to the first insulating layer. In a more particular embodiment, the process further includes planarizing the first insulating layer before forming the second insulating layer.

In a further embodiment of the first aspect, the process further includes forming a source region within the well region and adjacent to the primary surface, forming a well contact region within the well region and adjacent to the primary surface, wherein the well contact region has a higher peak dopant concentration as compared to the well region, and forming a gate electrode that overlies the well region and the first layer at the primary surface. In a particular embodiment, the process further includes forming a first interconnect, a second interconnect, and a third interconnect, wherein the first interconnect is electrically connected to the source region, the second interconnect is electrically connected to the conductive structure, and the third interconnect is electrically connected to the gate electrode. In yet a further embodiment, the electronic device includes a transistor, the transistor includes the first layer, the well region, the buried doped region, the sidewall doped region, and the conductive structure, and the transistor has an operating voltage of at least approximately 100 volts.

In a second aspect, a process of forming an electronic device can include providing a workpiece including a first layer, a well region, a well contact region, a source region, a buried doped region, and a gate electrode, wherein the first layer has a primary surface, the well region lies adjacent to the primary surface, the well contact region lies adjacent to the primary surface and within the well region and has a higher peak doping concentration as compared to the well region, the source region lies adjacent to the primary surface and within the well region and has a higher peak doping concentration as compared to the well region, the buried doped region is spaced apart from the primary surface and the well region, the gate electrode overlies the first layer and the well region, the first layer, the source region, and the buried doped region have a first conductivity type, and the well region and the well contact region have a second conductivity type opposite that of the first conductivity type. The process can also include etching a trench extending to the buried doped region, wherein portions of the first layer and the well region lie along a sidewall of the trench, and implanting a dopant into first layer along the sidewall of the trench. The process can further include depositing an insulating layer into the trench, anisotropically etching the insulating layer to form a sidewall spacer along the sidewall of the trench, depositing a conductive layer to fill a remaining portion of the trench, and polishing the conductive layer to form a conductive structure, wherein polishing removes a portion of the conductive layer that overlies the source region and the gate electrode, and the sidewall spacer lies between the conductive structure and the sidewall of the trench. The process can still further include forming a first interconnect, a second interconnect, and a third interconnect, wherein the first interconnect is electrically connected to the conductive structure, the second interconnect is electrically connected to the well contact region and the source region, and the third interconnect is electrically connected to the gate electrode.

In an embodiment of the second aspect, the electronic device includes a transistor, the transistor includes the first layer, the well region, the well contact region, the source region, the buried doped region, the gate electrode, a doped region along a sidewall of the trench and including the dopant, the sidewall spacer, the conductive structure, and the first, second, and third interconnects, and the transistor is capable of operating at a voltage difference between the first and second interconnects of at least approximately 100 volts. In another embodiment, the conductive structure includes a refractory metal-containing composition.

In a third aspect, an electronic device can include a first layer having a primary surface, a well region lying adjacent to the primary surface, and a buried doped region spaced apart from the primary surface and the well region. The electronic device can also include a trench extending towards the buried doped region, wherein the trench has a sidewall, a sidewall doped region along the sidewall of the trench, wherein the sidewall doped region extends to a depth deeper than the well region, and a conductive structure within the trench, wherein the conductive structure is electrically connected to the buried doped region and is electrically insulated from the sidewall doped region. The first layer and the buried doped region have a first conductivity type, and the well region has a second conductivity type opposite that of the first conductivity type.

In an embodiment of the third aspect, the electronic device further includes a well contact region lying adjacent to the primary surface and within the well region and having a higher peak doping concentration as compared to the well region, a source region laying adjacent to the primary surface and within the well region and having a conductivity type opposite that of the well region and the well contact region, and a gate electrode that overlies the well region and the first layer at the primary surface. In a particular embodiment, the electronic device further includes a first interconnect, a second interconnect, and a third interconnect, wherein the first interconnect is electrically connected to the conductive structure, the second interconnect is electrically connected to the source region, and the third interconnect is electrically connected to the gate electrode.

In another embodiment of the third aspect, the electronic device includes a transistor, the transistor includes the first layer, the well region, the buried doped region, the sidewall doped region, and the conductive structure, and the transistor has an operating voltage of at least approximately 100 volts. In still another embodiment, the sidewall doped region has a substantially uniform doping concentration along the sidewall of the trench for a majority of the sidewall doped region, and a doping profile wherein a doping concentration of the sidewall doped region decreases with a distance from the sidewall of the trench. In a further embodiment, a combination of the well region and the sidewall doped region extends along a majority of the sidewall of the trench. In still a further embodiment, the electronic device further includes a sidewall spacer including an insulating material, wherein the sidewall spacer lies between the conductive structure and each of the well region and the sidewall doped region.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A transistor comprising:
    a first layer having a primary surface;
    a well region including a channel region of the transistor, wherein the channel region is adjacent to the primary surface;
    a buried doped region spaced apart from the primary surface and underlying the well region, wherein the buried doped region includes a drain region of the transistor;
    a gate electrode of the transistor disposed over the primary surface;
    a trench extending towards the buried doped region, wherein the trench has a sidewall, and the trench is spaced apart from the channel region;
    a sidewall doped region along the sidewall of the trench, wherein the sidewall doped region extends to a depth deeper than the well region, and wherein when viewed from the top, the sidewall doped region is below the well region; and
    a conductive structure within the trench, wherein the conductive structure is electrically connected to the buried doped region and is electrically insulated from the sidewall doped region, wherein the conductive structure physically contacts either the buried doped region or a doped region located below the trench.

2. The transistor of claim 1, wherein:
    the first layer and the buried doped region have a first conductivity type; and
    the well region has a second conductivity type opposite that of the first conductivity type.

3. The transistor of claim 1, wherein substantially none of the gate electrode is disposed within the trench.

4. The transistor of claim 1, further comprising:
    a well contact region lying adjacent to the primary surface and within the well region and having a higher peak doping concentration as compared to the well region; and
    a source region of the transistor adjacent to the primary surface and within the well region and having a conductivity type opposite that of the well region and the well contact region.

5. The transistor of claim 4, wherein the conductive structure is closer to the source region than to the gate electrode.

6. The transistor of claim 1, wherein the transistor has an operating voltage of at least approximately 100 volts.

7. The transistor of claim 1, wherein the sidewall doped region has a substantially uniform doping concentration along the sidewall of the trench for a majority of the sidewall doped region, and a doping profile wherein a doping concentration of the sidewall doped region decreases with a distance from the sidewall of the trench.

8. The transistor of claim 1, wherein a combination of the well region and the sidewall doped region extends along a majority of the sidewall of the trench.

9. The transistor of claim 1, wherein the transistor is a VDMOS transistor.

10. An electronic device comprising:
    a first layer having a primary surface;
    a well region adjacent to the primary surface;
    a buried doped region spaced apart from the primary surface and the well region;
    a trench extending through the well region and towards the buried doped region, wherein from a cross-sectional view, the trench has a first sidewall and a second sidewall;
    a first transistor including:
        a channel region adjacent to the primary surface including a first portion of the well region, wherein the well region physically contacts a first sidewall surface of the trench;
        a source region adjacent to the primary surface;
        a gate electrode overlying the primary surface of the first layer; and
        a first sidewall doped region along the first sidewall of the trench, wherein the first sidewall doped region extends below the first portion of the well region;
    a second transistor including:
        a second portion of the well region that lies adjacent to a second sidewall surface of the trench, wherein from a cross-sectional view, the first sidewall surface is opposite the second sidewall surface;
        a source region adjacent to the primary surface; and
        a gate electrode overlying the primary surface of the first layer;
        a second sidewall doped region along a second sidewall of the trench, wherein the second sidewall doped region extends below the second portion of the well region; and
    a conductive structure within the trench, wherein the conductive structure is electrically connected to the first and second transistors and is electrically insulated from the sidewall doped region wherein the conductive structure physically contacts either the buried doped region or a doped region located below the trench.

11. The electronic device of claim 10, wherein each of the first and second transistors is a VDMOS transistor.

12. The electronic device of claim 10, wherein each of the source regions of the first and second transistor is spaced apart from the trench.

13. The electronic device of claim 10, wherein:
a channel region of the first transistor includes a part of the first portion of the well region lying along the primary surface; and
a channel region of the second transistor includes a part of the second portion of the well region lying along the primary surface.

14. The electronic device of claim 13, wherein the channel regions of the first and second transistors are spaced apart from the trench.

15. The electronic device of claim 10, wherein the sidewall doped region is formed at a dose in a range of approximately $1 \times 10^{12}$ ions/cm$^2$ or approximately $1 \times 10^{13}$ ions/cm$^2$.

16. The electronic device of claim 10, wherein:
the first sidewall doped region is immediately adjacent to the first portion of the well region and to a heavily doped region at a bottom of the trench; and
the second sidewall doped region is immediately adjacent to the second portion of the well region and spaced apart from the buried doped region.

17. The electronic device of claim 10, wherein the buried doped region is a common drain region for the first and second transistors.

18. The electronic device of claim 10, wherein substantially none of the gate electrodes of the first and second transistors are disposed in the trench.

19. The electronic device of claim 10, an insulating layer is disposed between the conductive structure and each of the first and second sidewall doped regions.

20. A transistor comprising:
a first layer having a primary surface;
a well region including a channel region of the transistor, wherein the channel region is adjacent to the primary surface;
a buried doped region spaced apart from the primary surface and underlying the well region, wherein the buried doped region includes a drain region of the transistor;
a gate electrode of the transistor disposed over the primary surface;
a trench extending through the well region towards the buried doped region, wherein the trench has a sidewall, and the trench is spaced apart from the channel region;
a sidewall doped region along the sidewall of the trench, wherein the sidewall doped region extends to a depth deeper than the well region; and
a conductive structure within the trench, wherein the conductive structure is electrically connected to the buried doped region and is electrically insulated from the sidewall doped region wherein the conductive structure physically contacts either the buried doped region or a doped region located below the trench.

* * * * *